United States Patent [19]
Katayama

[11] Patent Number: 5,075,618
[45] Date of Patent: Dec. 24, 1991

[54] WAVEFORM ANALYZER HAVING FUNCTION OF SIMULTANEOUSLY DISPLAYING WIDE- AND NARROW-BAND SPECTRA OR TRANSMISSION CHARACTERISTICS

[75] Inventor: Aiichi Katayama, Isehara, Japan

[73] Assignee: Anritsu Corporation, Tokyo, Japan

[21] Appl. No.: 644,220

[22] Filed: Jan. 22, 1991

[30] Foreign Application Priority Data

Jan. 25, 1990 [JP] Japan ................................ 2-15434

[51] Int. Cl.$^5$ ...................... G01R 13/20; H01J 29/70
[52] U.S. Cl. ............................ 324/77 CS; 324/77 R; 324/78 R; 324/638; 324/650; 324/121 R; 364/485; 340/723
[58] Field of Search ............... 307/263, 271; 340/713, 340/723, 724, 736; 364/518, 521, 485, 487; 324/77 CS, 77 R, 78 R, 638, 650, 121 R

[56] References Cited

U.S. PATENT DOCUMENTS

| 4,264,958 | 4/1981 | Rowell, Jr. et al. |
| 4,801,873 | 1/1989 | Takano. |
| 4,839,583 | 6/1989 | Takano et al. |
| 4,975,636 | 12/1990 | Desautels .................. 324/121 R |

FOREIGN PATENT DOCUMENTS 59-95472 6/1984 Japan.

OTHER PUBLICATIONS

Hale: "A Low-Freq. Spectrum Analyzer That Makes Slow Sweeps Practical", HP Journal, Sep. 1973.
Evel, "Digital Wavefrom Storage for the Oscilloscope Measurement System", HP Journal, Sep. 1982.

*Primary Examiner*—Kenneth A. Wieder
*Assistant Examiner*—Jose M. Solis
*Attorney, Agent, or Firm*—Frishauf, Holtz, Goodman & Woodward

[57] ABSTRACT

Display section displays, on a screen, a zone marker for indicating, on a wide-band spectrum display area, that part of a wide-band spectrum which corresponds to a selected narrow-band spectrum to be displayed, and the wide-band spectrum, as well as said narrow-band spectrum which has been enlarged. First setting section changes a center frequency or a band width of said displayed narrow-band spectrum, in accordance with the change of the position or width of the zone marker. Second setting section cooperating with the first setting section changes the position or width of the zone marker in accordance with the movement of the center frequency or band width of the displayed narrow-band spectrum. Control section for controlling a measurement resolution and a sweep time in accordance with the magnitude of the displayed spectrum, so as to satisfy the formula:

sweep time $\geq$ band width/(measurement resolution)$^2 \cdot$ K where K = a constant.

30 Claims, 14 Drawing Sheets

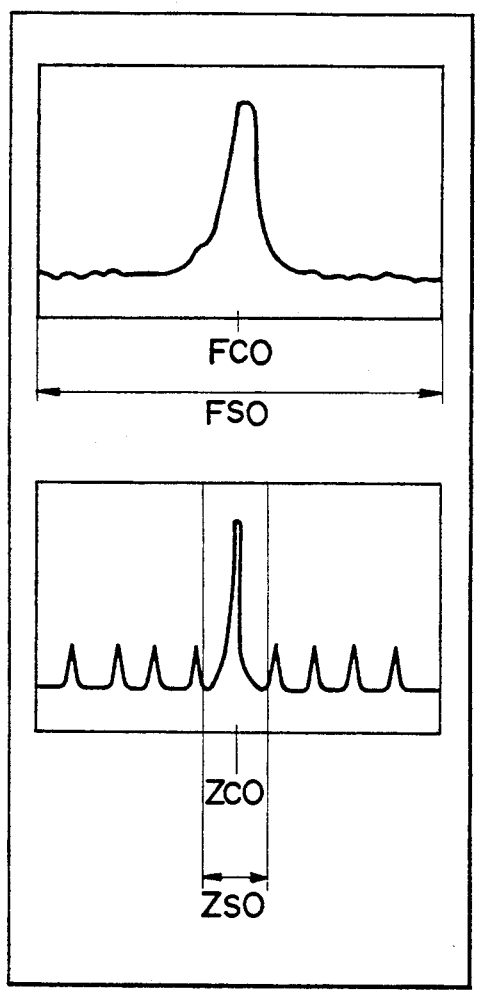 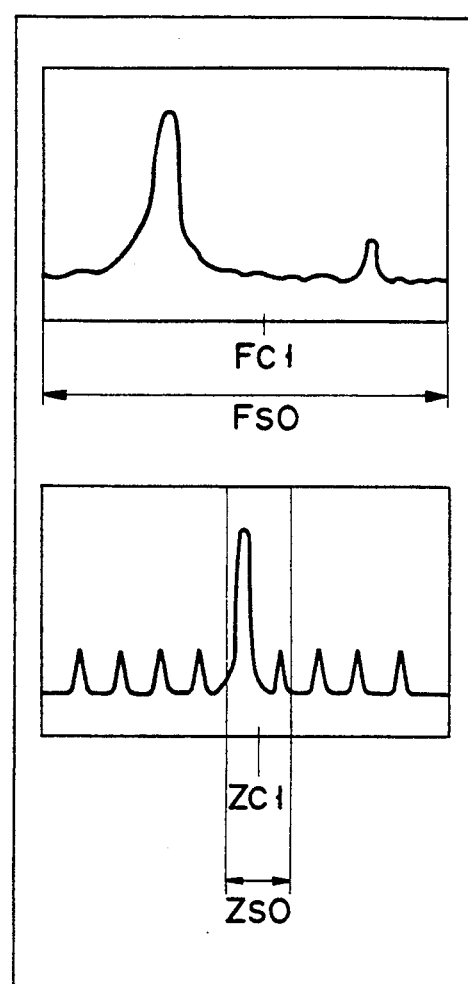
F I G. 4A          F I G. 4B

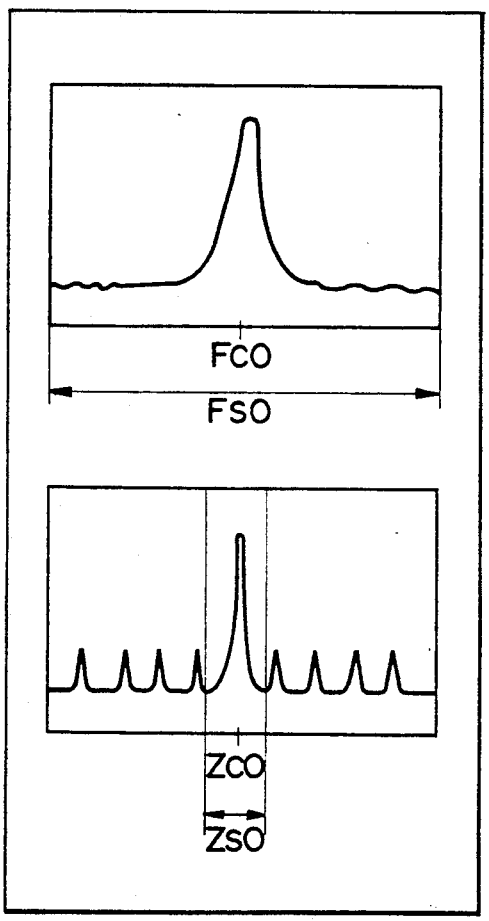
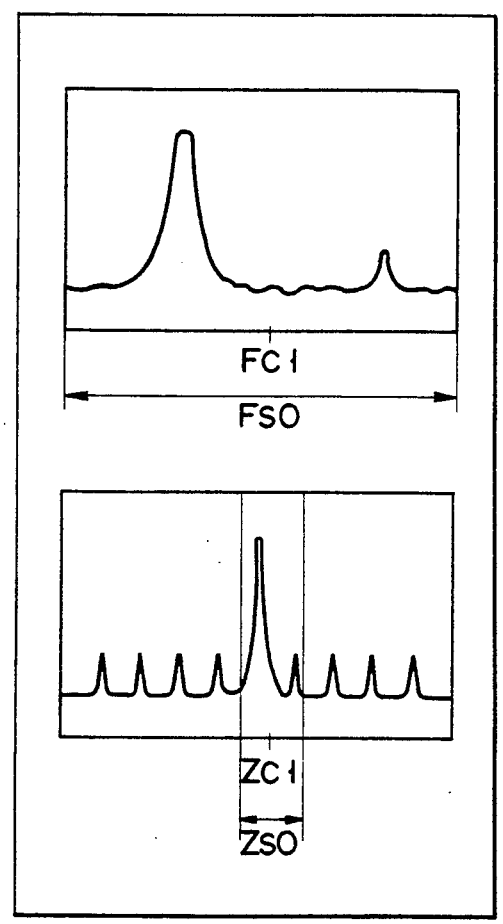
F I G. 6A  F I G. 6B

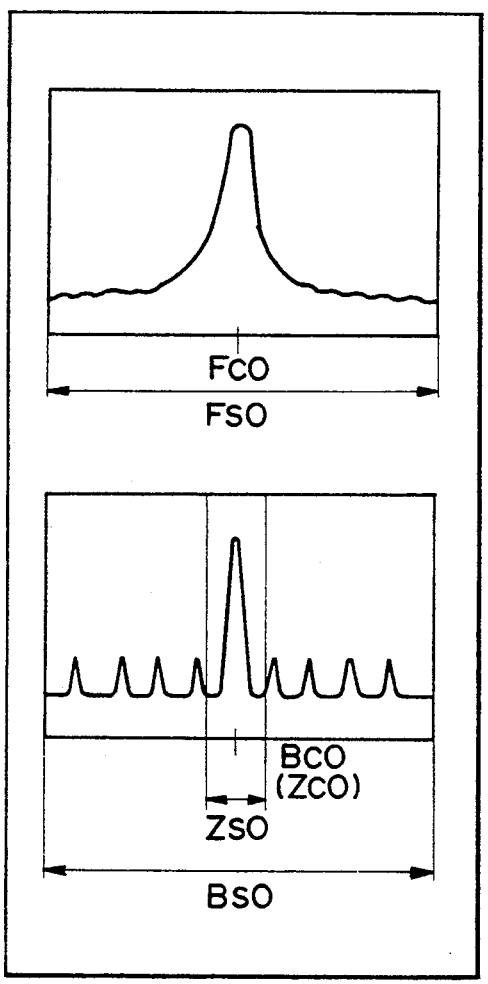
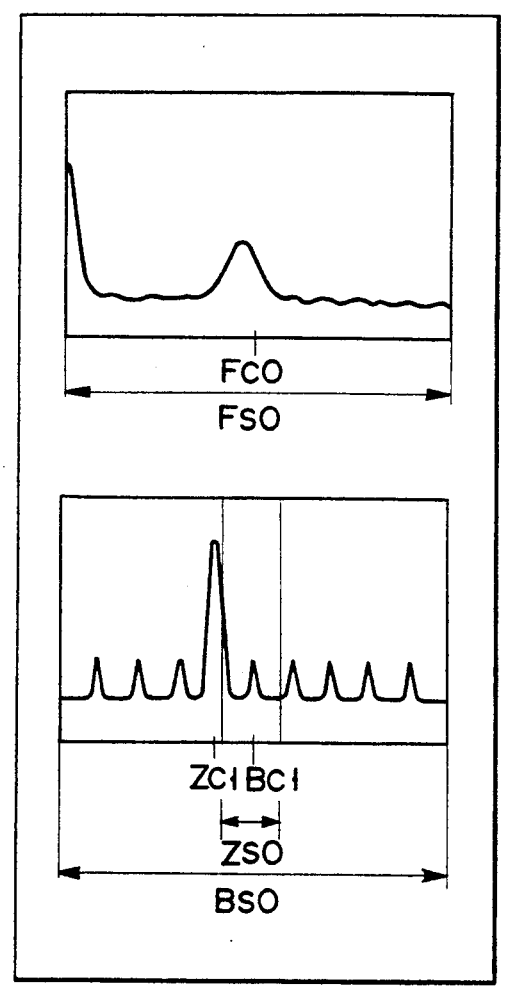
F I G. 10A          F I G. 10B

WAVEFORM ANALYZER HAVING FUNCTION OF SIMULTANEOUSLY DISPLAYING WIDE- AND NARROW-BAND SPECTRA OR TRANSMISSION CHARACTERISTICS

BACKGROUND OF THE INVENTION

1. Field of the Invention

The present invention relates generally to a waveform analyzer such as a spectrum analyzer and a network analyzer, and more particularly to a spectrum analyzer wherein an input signal is continuously frequency-converted to detect a spectrum of the input signal, and the spectrum is displayed with the magnitude thereof plotted on the ordinate and with the frequency thereof plotted on the abscissa and to a network analyzer wherein an input signal is continuously supplied to a device under tested with a variable frequency to detect an output signal of the device under tested, and the output signal is displayed with the magnitude thereof plotted o the ordinate and with the frequency thereof plotted on the abscissa.

This invention also relates to a spectrum analyzer wherein a spectrum measured in a certain band width is displayed on a first display unit as a wide-band spectrum, a desired part of the wide-band spectrum is designated by a zone marker, and the designated part is enlarged and displayed on a second display unit as a narrow-band spectrum. When the wide-band spectrum displayed on the first display unit and the narrow-band spectrum displayed on the second display unit are observed and the measurement conditions are determined, easy observation and operation is ensured.

This invention also relates to a network analyzer wherein a transmission characteristic measured in a certain band width is displayed on a first display unit as a wide-band transmission characteristic, a desired part of the wide-band transmission characteristic is designated by a zone marker, and the designated part is enlarged and displayed on a second display unit as a narrow-band transmission characteristic. When the wide-band transmission characteristic displayed on the first display unit and the narrow-band transmission characteristic displayed on the second display unit are observed and the measurement conditions are determined, easy observation and operation is ensured.

2. Description of the Related Art

Conventional techniques relating to the measurement and display of an input signal, as stated above, are disclosed in Published Unexamined Japanese Patent Application No. 59-95472 (hereinafter referred to as Prior Art 1) in which such techniques are applied to an oscilloscope.

In a waveform display, which was known before the filing date of Prior Art 1, it was necessary to make variable the gain of a vertical-axis amplifier or a horizontal-axis amplifier for driving a CRT (cathode-ray tube), in order to increase the amplitude or time axis of waveform. In this case, if the gain is varied at a variable DC level, the variable DC level is simultaneously increased. Consequently, if the the variable DC level is changed by the same degree as in the non-increase time, the display position of an enlarged display waveform moves to a greater degree than in the non-increase time. Since the display movement speed of the enlarged display waveform increases, it is difficult to suitably adjust the display position.

Under the situation, in the waveform display of Prior Art 1 wherein a waveform is displayed and a part of the displayed waveform is selected and enlarged, the ratio of enlargement is found when the displayed waveform is enlarged. In accordance with the ratio of enlargement, the movement speed of the waveform or cursor is decreased, and the adjustment of the display position is made easy.

In other words, in this art, the movement speed is decreased by the degree corresponding to the amplified variable DC level at the time of enlargement (i.e. corresponding to the above-mentioned ratio). For example, suppose that the knob on the panel for moving a cursor is operated (adjusted) by a predetermined degree, in order to move the cursor to a predetermined display point, while observing the display. Consequently, a signal (corresponding to the above-mentioned variable DC level) for moving the cursor is, in fact, output by a predetermined amount. At this time, the ratio (movement speed) between the degree of this operation (adjustment) and the actual movement distance of the cursor on the display is kept at a predetermined value, irrespective of the non-enlargement time or enlargement time. Thus, the operation of moving the waveform or cursor on the display is made easier.

A conventional spectrum analyzer is disclosed in U.S. Pat. No. 4,264,958 (hereinafter referred to as Prior Art 2). This spectrum analyzer employs a technique of so-called zoom function. During the measurement display in a given spectrum range, the frequency of a point designated by a marker or a peak point of the spectrum is used as a center frequency, and the band width is narrowed. The narrowed band width is measured and enlarged for display.

When Prior Art 1 is applied to a spectrum analyzer, the following problems will occur.

The device of Prior Art 1 is designed for measurement of a waveform in a time region, with use of an oscilloscope. If the waveform is enlarged for display, the measurement resolution is increased. Thus, the function itself of keeping the movement speed on the display at a constant value is effective.

However, a spectrum analyzer has not only the same display function as an oscilloscope, but also has a measuring unit for detecting the level of a spectrum in a frequency region. Thus, in the spectrum analyzer, when the band width for measurement is changed for enlarged measurement display, the display resolution based on frequency (frequency width per unit distance on the abscissa) is increased, even if the movement speed on the CRT display is unchanged like the oscilloscope. Under the situation, regarding the spectrum analyzer, since the measurement resolution of the measuring unit must be increased in accordance with the enlarged width, it is necessary to set the measurement resolution and sweep time of the measuring unit in accordance with the band width for enlarged measurement display and under optimal error-free conditions.

It should be noted that in the spectrum analyzer the measurement resolution and the sweep time of the measuring unit have the relationship: when the frequency is swept at a higher speed than the speed required when the measuring unit detects the level at a predetermined frequency resolution (hereinafter called "resolution"), the error increases, while the frequency is swept at a lower speed, the measurement precision is better but longer time is consumed.

Regarding the zoom function in Prior Art 2, where the enlarged display is restored to the normal (non-enlarged) display for measurement, the measurement conditions for the non-enlarged display must be set once again.

Neither Prior Art 1 nor 2 teaches the technical concept of the present invention: a wide-band spectrum and a narrow-band spectrum are measured and displayed and observation and operation can be carried out with a measurement resolution of the band width of each spectrum and, simultaneously, the condition changed for measurement in one band is reflected on the condition for measurement in another band. Thus, the conventional devices are inconvenient when the spectrum analyzer is used to alternately measure and display the wide-band spectrum and narrow-band spectrum and set and control the conditions therefor. There is a strong demand that these problems be solved urgently in the spectrum analyzer and the network analyzer.

SUMMARY OF THE INVENTION

It is, therefore, an object of the present invention to provide a new and improved spectrum analyzer having a function of simultaneously displaying wide- and narrow-band spectra, which analyzer can enhance the operability and observation property in measuring and observing the wide-band spectrum and narrow-band spectrum alternately.

It is, therefore, another object of the present invention to provide a new and improved network analyzer having a function of simultaneously displaying wide- and narrow-band transmission characteristics, which analyzer can enhance the operability and observation property in measuring and observing the wide-band transmission characteristic and narrow-band transmission characteristics alternately.

According to a first aspect of the present invention, there is provided a spectrum analyzer comprising:

measuring means for alternately outputting wide-band spectrum data and narrow-band spectrum data relating to a signal to be measured;

waveform memory means for storing the wide-band spectrum data and narrow-band spectrum data output alternately from the measuring means;

display means having a first display area for displaying the wide-band spectrum data stored in the waveform memory means and a second display area for enlarging and displaying the narrow-band spectrum data stored in the waveform memory means; and parameter setting means comprising:

a) a first setting unit for providing the measuring means with a first measurement condition for outputting the wide-band spectrum data;

b) a second setting unit for providing the display means with a zone display condition for displaying, on the first display area, a zone marker having a desired position and a desired width relating to the wide-band spectrum data;

c) first display change means for providing the measuring means with a second measurement condition for outputting the narrow-band spectrum data corresponding to the zone display condition, in accordance with the zone display condition provided by the second setting unit, for changing the second measurement condition for the measuring means, in accordance with the zone display condition provided by the second setting unit, for changing one of the position and the width of the zone marker displayed on the first display area of the display means, and for changing one of the center frequency and the band width of the narrow-band spectrum data enlarged and displayed on the second display area;

d) a third setting unit for providing the measuring means with a third measurement condition for changing and outputting the narrow-band spectrum data set under the second measurement condition; and e) a second display change means for changing one of the center frequency and the band width of the narrow-band spectrum data enlarged and displayed on the second display area of the display means in accordance with the third measurement condition provided by the third setting unit, and for changing one of the position and the width of the zone marker displayed on the first display area.

More specifically, in order to achieve the above object, the spectrum analyzer of the present invention is basically provided with first display change means for associating wide-band spectrum display with narrow-band spectrum display, and second display change means for associating, inversely, the narrow-band spectrum display with the wide-band spectrum display. Additionally, the spectrum analyzer has measuring control means for setting a measuring unit in optimal conditions for the wide-band spectrum display and narrow-band spectrum display.

According to one specific mode of the spectrum analyzer of the invention, a spectrum measured at a certain band width is displayed as a wide-band spectrum. A desired part of the wide-band spectrum is designated by a zone marker, and the designated part is enlarged and displayed as a narrow-band spectrum.

This spectrum analyzer comprises:

(a) background measurement setting means for setting a center frequency and a band width, which are measurement conditions for wide-band spectrum display;

(b) zone setting means for changing the position and width of the zone marker for designating a desired narrow-band spectrum to be enlarged and displayed, while wide-band spectrum display is being carried out;

(c) display control means for displaying the wide-band spectrum and the zone marker on a predetermined display area of the display, and displaying the narrow-band spectrum designated by the zone marker on another display area of the display;

(d) forward ground measurement setting means for setting the center frequency and band width which are measurement conditions, while observing the narrow-band spectrum display;

(e) first display change mean for changing the center frequency and band width of the narrow-band spectrum display in accordance with the change of the position or width of the zone marker; and (f) second display change means for changing the position or width of the zone marker, in accordance with the movement of the center frequency or band width of the narrow-band spectrum display, that is, the change brought about by the first display change means.

According to another mode of the invention, there is provided a spectrum analyzer comprising, in addition to the above indispensable elements (a) to (f):

(g) measuring control means for finding an optimal measurement resolution and an optimal sweep time, on the basis of the information from the means ((a) and (d)) for setting the center frequency or band width of each of the displayed wide-band spectrum and narrow-band spectrum, and for controlling the measuring unit under optical measurement conditions on the basis of these found values according to the following formula:

$$\text{sweep time} \geq \text{band width}/(\text{measurement resolution})^2 \cdot K$$

where K = a constant.

According to a second aspect of the present invention, there is provided a network analyzer comprising:

measuring means for alternately outputting wide-band transmission characteristic data and narrow-band transmission characteristic data relating to a device under tested according to a test signal which is being tracked;

waveform memory means for storing the wide-band transmission characteristic data and narrow-band transmission characteristic data output alternately from the measuring means;

display means having a first display area for displaying the wide-band transmission characteristic data stored in the waveform memory means and a second display area for enlarging and displaying the narrow-band transmission characteristic data stored in the waveform memory means; and parameter setting means comprising:

a) a first setting unit for providing the measuring means with a first measurement condition for outputting the wide-band transmission characteristic data;

b) a second setting unit for providing the display means with a zone display condition for displaying, on the first display area, a zone marker having a desired position and a desired width relating to the wide-band transmission characteristic data;

c) first display change means for providing the measuring means with a second measurement condition for outputting the narrow-band transmission characteristic data corresponding to the zone display condition, in accordance with the zone display condition provided by the second setting unit, for changing the second measurement condition for the measuring means, in accordance with the zone display condition provided by the second setting unit, for changing one of the position and the width of the zone marker displayed on the first display area of the display means, and for changing one of the center frequency and the band width of the narrow-band transmission characteristic data enlarged and displayed on the second display area;

d) a third setting unit for providing the measuring means with a third measurement condition for changing and outputting the narrow-band transmission characteristic data set under the second measurement condition; and e) a second display change means for changing one of the center frequency and the band width of the narrow-band transmission characteristic data enlarged and displayed on the second display area of the display means in accordance with the third measurement condition provided by the third setting unit, and for changing one of the position and the width of the zone marker displayed on the first display area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently referred embodiments of the invention and, together with the general description given above and the detailed description of the preferred embodiment given below, serve to explain the principles of the invention, in which:

FIG. 4A to 11B show display examples for explaining the operation of FIG. 1A;

DETAILED DESCRIPTION OF THE PREFERRED EMBODIMENTS

Figure 1A:
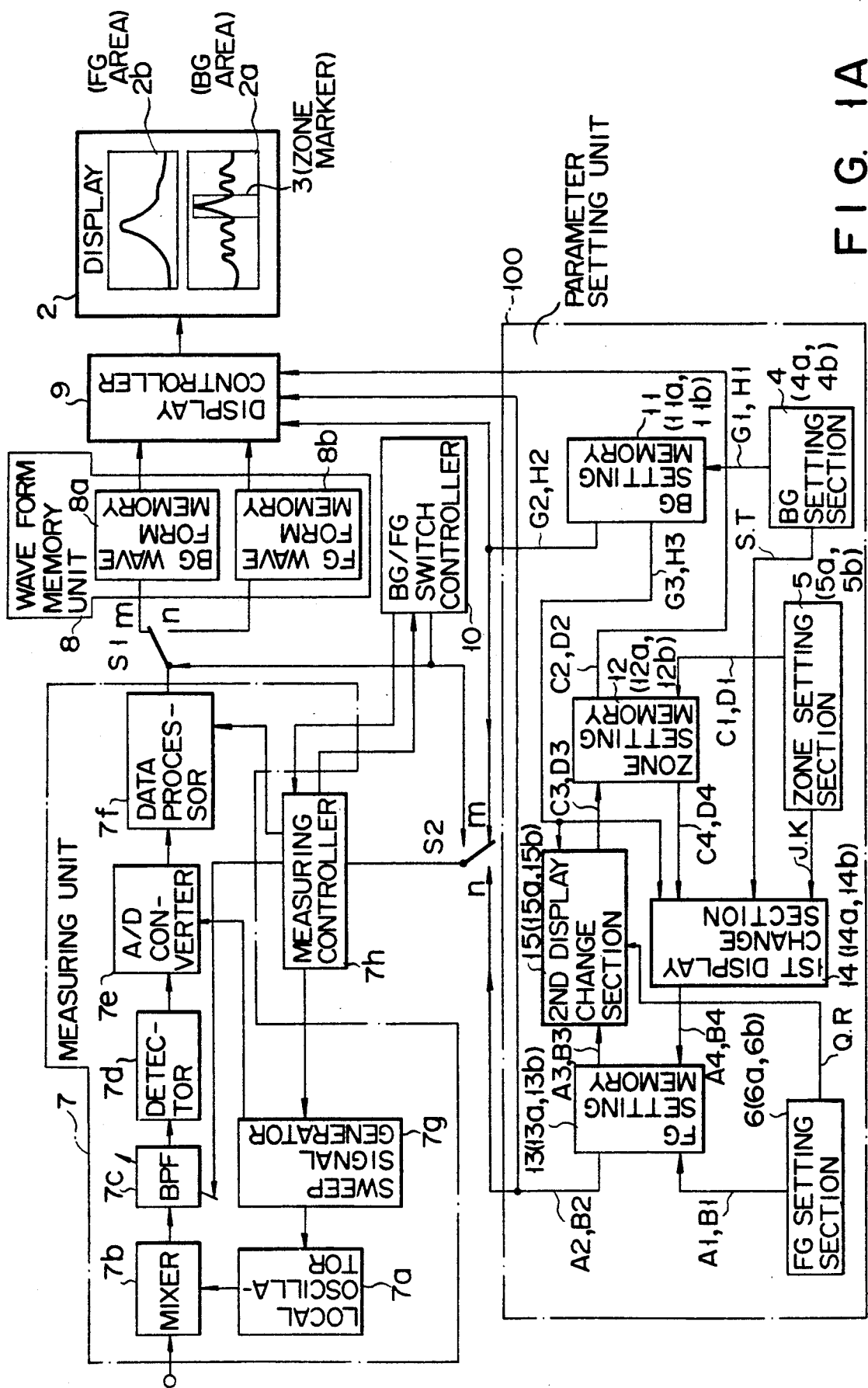
FIG. 1A shows the structure of an embodiment of the present invention.

Reference will now be made in detail to the presently preferred embodiment of the invention as illustrated in the accompanying drawings, in which like reference characters designate like or corresponding parts throughout the several drawings.

Figure 2:
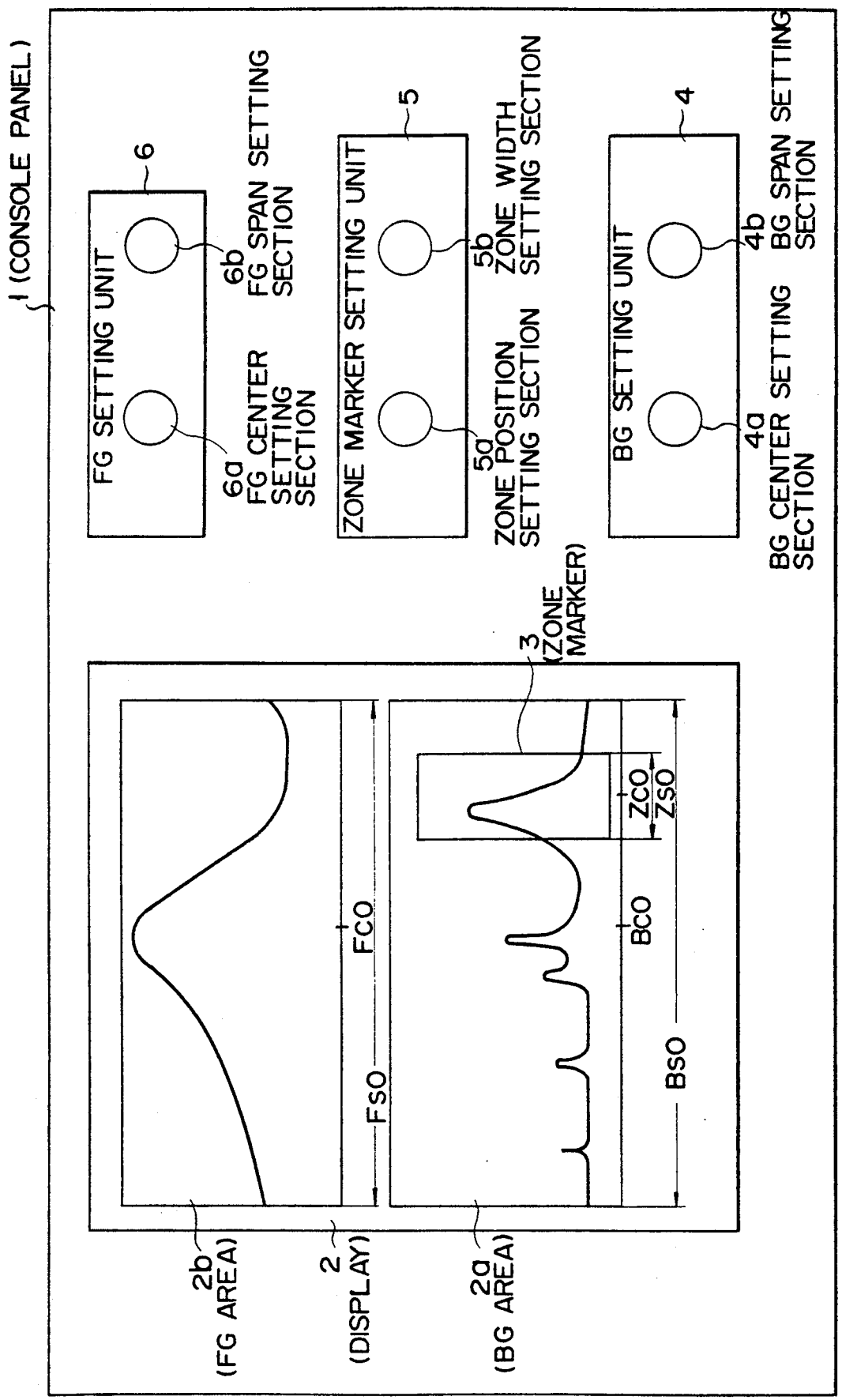
FIG. 2 is a view for explaining the operability of the invention, by referring to an example of the structure of a console panel according to this invention.

FIG. 1A shows the structure of an embodiment of this invention applied to a spectrum analyzer, and FIG. 2 shows an example of a console panel 1 of this invention which includes a display. First, the operability of the invention will be described with reference to FIG. 2, and then the structure and operation of the embodiment will be described.

In FIG. 2, the display screen of a display 2 includes a BG (Background Measurement) are 2a for display of a wide-band spectrum, and an FG (Forward Ground Measurement) area 2b for display of a narrow-band spectrum.

In FIG. 2, a BG setting unit 4, a zone marker setting unit 5 and an FG setting unit 6 are designed such that an operator can set the units 4, 5 and 6 at desired values by means of their corresponding knobs.

In the following description, examples of numerical values are shown in parentheses (11).

A center frequency Bco (=1000 MHz) and a band width Bso (=500 MHz) for wide-band spectrum display are set by a BG center setting section 4a and a BG span setting section 4b in the BG setting unit 4. Suppose that the number of display points P in the abscissa (frequency axis) on the display screen is 500. In this case, the display resolution for wide-band spectrum display is Bso/P (=1 MHz).

A center position Zco (=400) and a width Zso (=50) of a zone marker 3 on the wide-band spectrum display are set by the number of points by a zone position setting section 5a and a zone width setting section 5b in the zone marker setting unit 5. Accordingly, a minimum frequency (hereinafter called "set resolution") capable of being set by the zone position setting section 5a and zone width setting section 5b is Bso/P (=1 MHz).

A center frequency Fco (=1150 MHz) and a band width Fso (=50 MHz) for narrow-band spectrum display are determined by frequencies calculated on the basis of the number of points set by the zone position section 5a and zone width setting section 5b. In this case, the set resolution determined by the zone marker setting unit 5 is Bso/P (=1 MHz), but the display resolution is Fso/P (=0.1 MHz).

On the other hand, the FG setting unit 6 is provided with an FG center setting section 6a and an FG span setting section 6b in order to vary a center frequency Fco (=1150 MHz) and a band width Fso (=50 MHz) while observing the narrow-band spectrum display. The set resolution of the FG center setting section 6a and FG span setting section 6b is, like the display resolution, Fso/P (=0.1 MHz).

The center frequency and band width varied by the FG center setting section 6a and FG span setting section 6b are reflected on the center position Zc and width Zs of the zone marker 3 displayed on the BG area 2a. At this time, the resolution depends on the display resolution Bso/P (=1 MHz) of the BG area 2a.

The console panel 1, having the above structure, enables the following operations to be carried out.

When observing the wide-band spectrum of the BG area 2a during measurement, the zone marker 3 can be set with the set resolution corresponding to the band width, thereby selecting and displaying the narrow-band spectrum.

Where the selected narrow-band spectrum on the FG area 2b is observed and the center frequency and band width thereof are varied on an as needed basis, they can be varied with the set resolution corresponding to the band width.

When the BG area 2a is observed once again, the zone marker 3 can be displayed with the varied center frequency and band width of the narrow-band spectrum.

As has been described above, according to the present invention, the wide-band spectrum display on the BG area 2a and the narrow-band spectrum display on the FG area 2b can be alternately observed and controlled smoothly.

FIG. 1A shows the structure of an embodiment of the invention.

In FIG. 1A, a measuring unit 7 detects a spectrum of a signal to be measured in a frequency region, and outputs a signal representing a level of the spectrum corresponding to the frequency. In the measuring unit 7, a mixer 7b converts an input signal into an intermediate frequency signal, while the mixer 7b receives a signal from a local oscillator 7a. The intermediate frequency signal is selected and analyzed by a variable band-width BPF (band-pass filter) 7c. The analyzed intermediate frequency signal is detected by a detector 7d, and an output from the detector 7d is converted into a digital signal by an A/D converter 7e. The digital signal is processed into spectrum data having a desired band by a data processor 7f. The spectrum generator 7g sweeps an oscillation frequency of the local oscillator 7a, with a predetermined frequency as a center frequency, over a predetermined band width and for a predetermined sweep time. The band of the variable band-width BPF 7c determines the measurement resolution of the spectrum analyzer, when a signal is selected and analyzed on a frequency basis. The band of the BPF 7c, i.e. the measurement resolution, is variable.

A measuring controller 7h controls the respective parts so that the measurement band width, sweep time and resolution band width (RBW), which are controlled as stated above, may satisfy the relationship represented by formula (1), thereby bringing the error of spectrum measurement to an optimal value for the measuring device.

$$\text{sweep time} \geq \text{band width}/(\text{measurement resolution})^2 \cdot K \quad (1)$$

where K=a constant.

In this embodiment, K is set to a value between 2 and 5.

In formula (1), factors other than constant K are determined, taking into account the influence on the error by mainly the local oscillator 7a and BPF 7c, where the measurement is performed with desired band width and measurement resolution. The measurement error of the entire measurement device, however, is influenced by the factors other than the above factors, e.g. time response and noise of each part. Thus, the constant K is set to a value, such that the error of the entire measurement device is decreased.

Figure 1B:
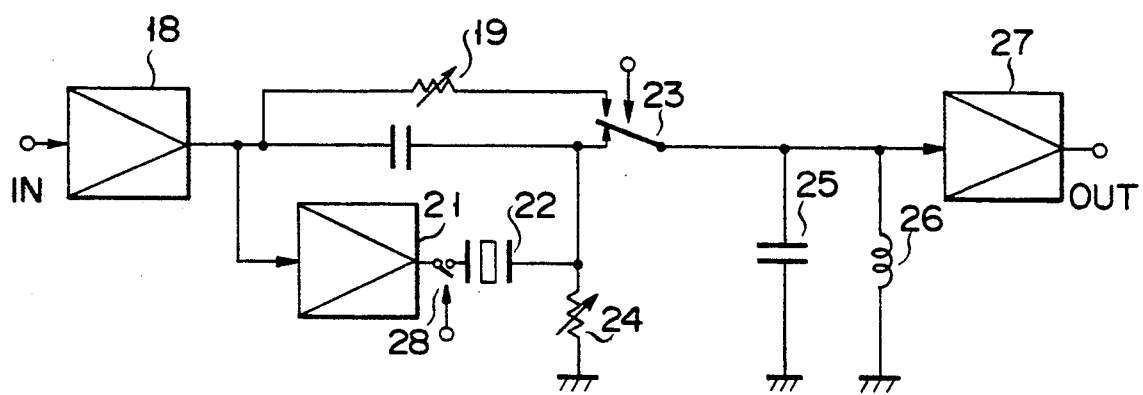
FIG. 1B shows an example of a band-pass filter shown in FIG. 1A.

FIG. 1B shows a specific example of the BPF 7c, which is a single-stage filter circuit. Actually, a plurality of such filter circuits are constructed in a multiple stage (e.g. 4 to 6 stages). The combination of the filter circuits changes the RBW.

The filter circuit shown in FIG. 1B comprises:

a first amplifier 18 having a low output impedance and receiving an input signal to be filtered a second amplifier 27 having a high input impedance and sending out a filtered output signal;

an LC parallel resonance circuit (25, 26) connected between the input terminal of the second amplifier and a base potential;

a first Q variable resistor 19 which may be connected in series between the output of the first amplifier and the LC parallel resonance circuit;

a crystal resonator which may be connected in series between the output of the first amplifier and the LC parallel resonance circuit;

a parallel circuit (20, 22) of the crystal resonator and a capacitance element, wherein a voltage having a phase opposite to the phase of the voltage applied to an end of the crystal resonator is applied to the other end of the crystal resonator through the capacitance element;

a second Q variable resistor 24 connected between an end of the parallel circuit and the base potential; and a change-over switch 23 for enabling the first Q variable resistor 19 or the parallel circuit (20, 22) to be connected between the output of the first amplifier and the LC parallel resonance circuit.

This type of filter circuit is applicable to a band-width variable band-pass filter circuit. In particular, in a spectrum analyzer, the filter circuit comprises a wide band-pass filter having a large frequency band width for receiving an unknown signal, and a narrow band-pass filter for receiving a signal of a desired frequency in a narrow band. Either the wide band-pass filter or the narrow band-pass filter is selected by the switch 23, depending on the object to be analyzed.

A switch 28 stops the input/output of the crystal resonator when the LC filter is operated, thereby preventing the influence of the crystal resonator. Specifically, when the LC circuit is operated, a signal from the crystal resonator may adversely affect the characteristic of the LC filter, resulting in a failure to attain its inherent characteristic. This problem can be solved by the use of the switch 28.

The switches 23 and 28 are supplied with changeover signals from the measuring controller 7h shown in FIG. 1A.

By applying this filter circuit to a band-pass filter for determining the resolution band width of the spectrum analyzer, the circuit scale can be halved substantially, compared to the prior art, with the performance of the analyzer unchanged.

Referring back to FIG. 1A, a waveform memory unit 8 comprises a BG waveform memory 8a and an FG waveform memory 8b for storing, respectively, the levels of a wide band spectrum and a narrow band spectrum at addresses associated with measurement frequencies. The addresses of the BG waveform memory 8a and the FG waveform memory 8b are associated with display points on the abscissa on the screen of the display 2. The number of addresses of each memory is equal to the number of the display points. Accordingly, when the spectra are displayed, the narrow band spectrum is made larger than the wide band spectrum in accordance with the band ratio therebetween. Thus, the reading resolution in relation to respective frequencies is enhanced.

A display controller 9 enables the wide band spectrum and narrow band spectrum stored in the BG waveform memory 8a and FG waveform memory 8b to be displayed on the areas 2a and 2b of the display 2. In addition, the display controller 9 displays a zone marker 3 for selecting a narrow band in a wide band spectrum displayed on the area 2a.

A BG/FG switch controller 10 sweeps the wide band spectrum and narrow band spectrum alternately on the measuring controller 7h, and outputs a start signal to be measured. In synchronism with the sweep, switches S1 and S2 are controlled such that the switches are brought to the m-side at the time of wide band spectrum measurement and to the n-side at the time of narrow band spectrum measurement.

Figure 3:
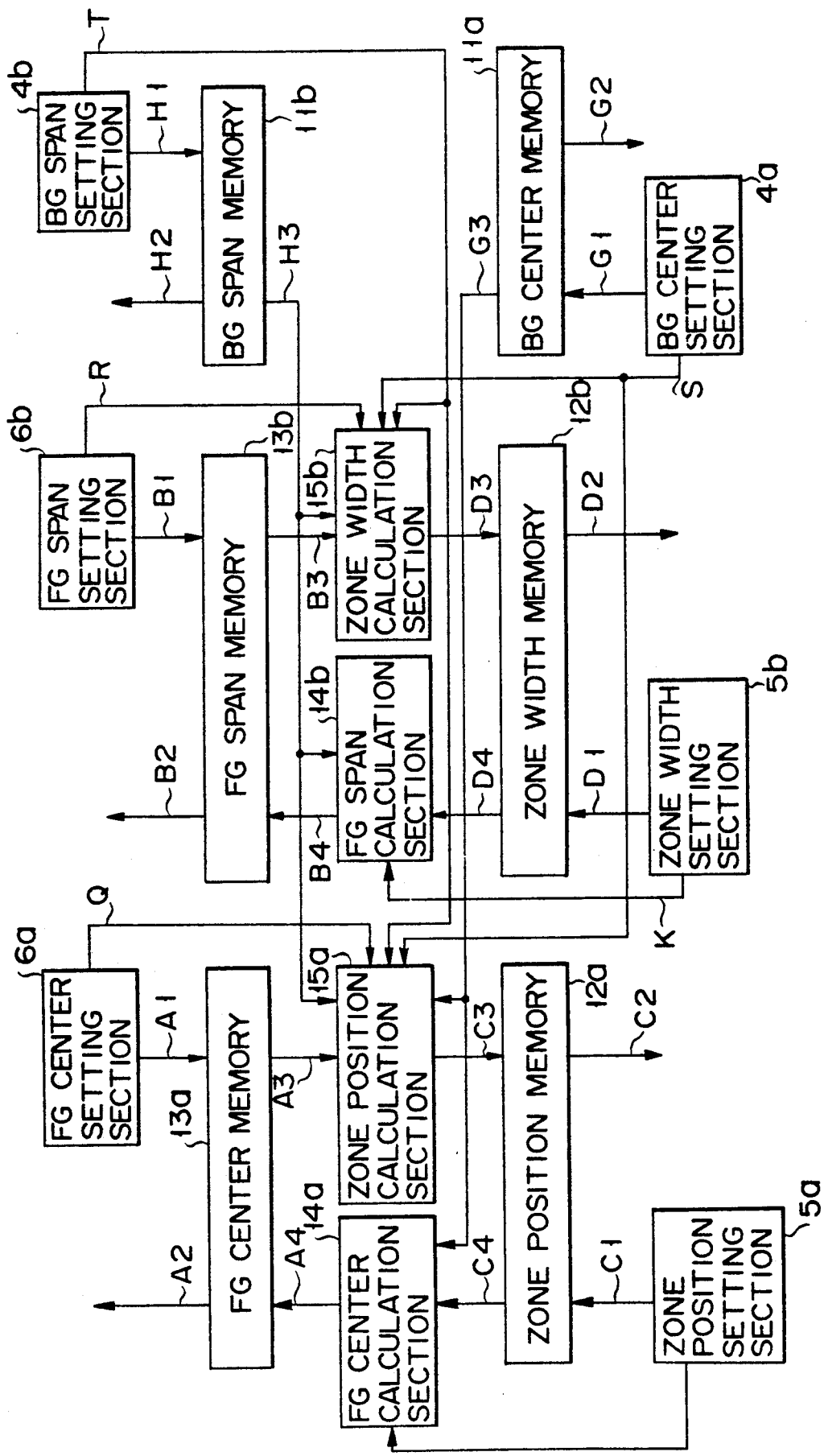
FIG. 3 shows in detail the structure of a parameter output unit employed in the embodiment of FIG. 1.

A parameter setting unit 100 constitutes a main part of this embodiment of the invention. The function blocks of the unit 100 are shown in detail in FIG. 3. The structure of the unit 100 will now be described by referring mainly to FIG. 1, as well as FIG. 3.

In FIG. 1, a first display change section 14 receives zone marker position information C4 and zone marker width information D4 from a zone setting memory 12. In accordance with the information C4, D4, the first display change section 14 finds, by arithmetic operation, a center frequency (center information A4) or band width (span information B4) of narrow band spectrum display. The found information A4 or B4 is stored in an FG setting memory 13. The first display change section 14 comprises an FG center calculation section 14a and an FG span calculation section 14b. The arithmetic operation is started by trigger signals J and K from a zone setting section 5 and trigger signals S and T from a BG setting section 4.

A second display change section 15 receives center information A3 and span information B5 for narrow band spectrum display from the FG setting memory 13. In accordance with the information A3, B3, the second display change section 15 finds, by arithmetic operation, a position (position information C3) and a width (width information D3) of wide band spectrum display. The found information C3, D3 is stored in the zone setting memory 12. The second display change section 15 comprises a zone position calculation section 15a and a zone width calculation section 15b. The arithmetic operation is started by trigger signals Q and R from an FG setting section 6.

The zone setting memory 12 comprises a zone position memory 12a for storing the position information of the zone marker and a zone width memory 12b for storing width information. The zone position memory 12a receives position information C1 from the zone setting section 5 or position information C3 from the second display change section 15. The zone width memory 12b receives width information D1 from the zone setting section 5 or width information D3 from the second display change section 15. The memories 12a and 12b store such information each time they receive it, and therefore the stored information is always updated. The stored information is sent to the display controller 9 as position information C2 and width information D2. On the basis of the position information C2 and width information D2, the zone marker is set on the wide band spectrum display.

The FG setting memory 13 comprises an FG center memory 13a and an FG span memory 13b for storing center information and span information relating to narrow-band spectrum display. The FG center memory 13a receives center information A1 from the FG setting section 6 or center information A4 from the first display change section 14. The FG span memory 13b receives span information B1 from the FG setting section 6 or span information B4 from the first display change section 14. The memories 13a and 13b store such information each time they receive it, and the stored information is always updated. In addition, the latest stored center information and span information is sent to the switch S2 and the display controller 9 as center information A2 and span information B2, and similarly sent to the second display change section 15 as center information A3 and span information B3. On the basis of the center information A2 and span information B2 sent to the switch S2 and the display controller 9, the measuring unit 7 performs narrow-band spectrum measurement under such conditions, and the FG waveform memory 8b stores spectrum data. The display controller 9 enables the display 2 to display the narrow-band spectrum. On the other hand, on the basis of the center information A3 and span information B3 sent to the second display change section, the latest zone marker is set on the wide-band spectrum display of the display 2.

The BG setting memory 11 stores center information g1 and span information H1 relating to wide-band spectrum display, which information is delivered from the BG setting section 4. The memory 11 outputs the information G1, H1 to the first display change section 14, second display change section 15 and display controller 9. The BG setting memory 11 includes a BG center memory 11a and a BG span memory 11b.

In the above construction, in particular, the measuring controller 7h, display controller 9, first display change section 14 and second display change section 15 are constituted by a microcomputer and its peripheral circuits (CPU, ROM, RAM, etc.).

A sequence of operations in the above embodiment will now be described along the flow of information set by the respective setting sections. Sections [I] to [VIII] in the following description correspond to the information items to be set.

For the purpose of clearer description, the initial conditions for setting operations are determined as follows:

(Initial conditions for wide-band spectrum display)
  Value (Hz) of center frequency: Bco
  Value (Hz) of span: Bso
(Initial conditions for narrow-band spectrum display)
  Value (Hz) of center frequency: Fco
  Value (Hz) of span: Fso
(Initial conditions for marker zone)
  Value (number of points) of position: Zco
  Value (number of points) of width: Zso
  Number of points on the abscissa of the display screen of display 2:500.

[I] Setting of Position of Zone Marker

The upper and lower parts of FIG. 4A show initial display screens for wide-band spectrum display and narrow-band spectrum display before the position of the zone marker is changed.

(1) The position of the zone marker is changed by the zone position setting section 5a. At this time, the zone position setting section 5a outputs a position value Zcl (value of position information C1).

(2) The zone position memory 12a stores the value Zcl of position information C1 and sends out the value Zcl to the display controller 9 as position information C2, thus changing the position of the zone marker on the wide-band spectrum display in accordance with the value Zcl. The lower part of FIG. 4B shows the changed position of the zone marker. The width of the zone marker is unchanged and is Zso.

(3) The FG center calculation section 14a receives the value Zcl of position information C4 from the zone position memory 12a. On the basis of this value, as well as the value Bco of center information G3 and value Bso of span information H3 both determined previously by the BG center setting section 4a and BG span setting section 4b, the FG center calculation section 14a calculates center frequency Fcl for narrow-band spectrum measurement according to the following equation and outputs the center frequency as center information A4.

$Fcl = (Bco - Bso/2) + Bso \cdot (Zcl/500)$ (4) The FG center memory 13a stores the value Fcl of center information A4 and outputs the value Fcl as value of center information A2.

(5) When the switch 2 is set to the n-side by the BG/FG switch controller 10, the measuring controller 7h receives the value Fcl of center information A2 and the value Fso of span information B2, thereby enabling the respective parts of the measuring unit 7 to perform narrow-band spectrum measurement with the center frequency Fcl and the band width Fso.

(6) FG waveform memory 8b stores the level of each spectrum output from the data processor 7f in relation to the corresponding frequency.

(7) The display controller 9 enables the FG area 2b of the display to display the level of each spectrum stored in the FG waveform memory 8b, in relation to the corresponding frequency.

Consequently, the narrow-band spectrum displayed on the upper screen of FIG. 4A is changed, as shown on the upper screen of FIG. 4B.

[II] Setting of Width of Zone Marker

Figure 5B:
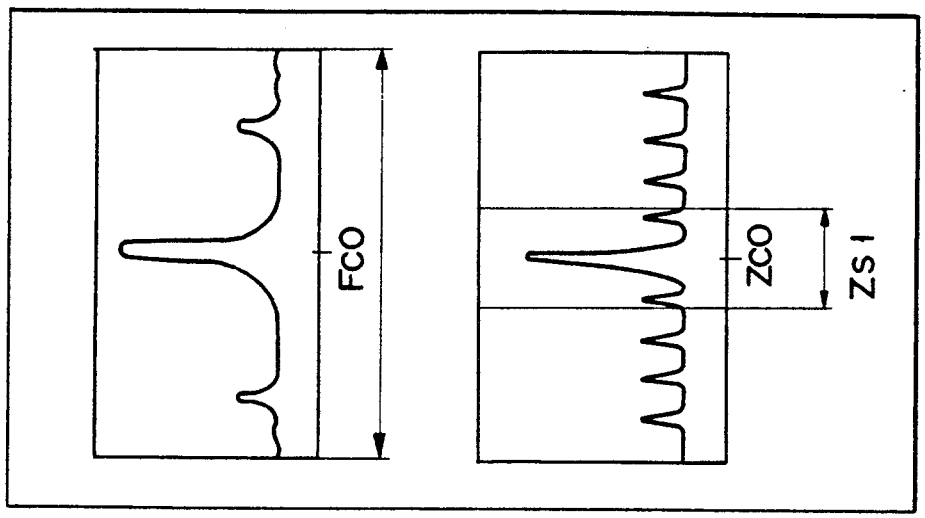
Figure 5A:
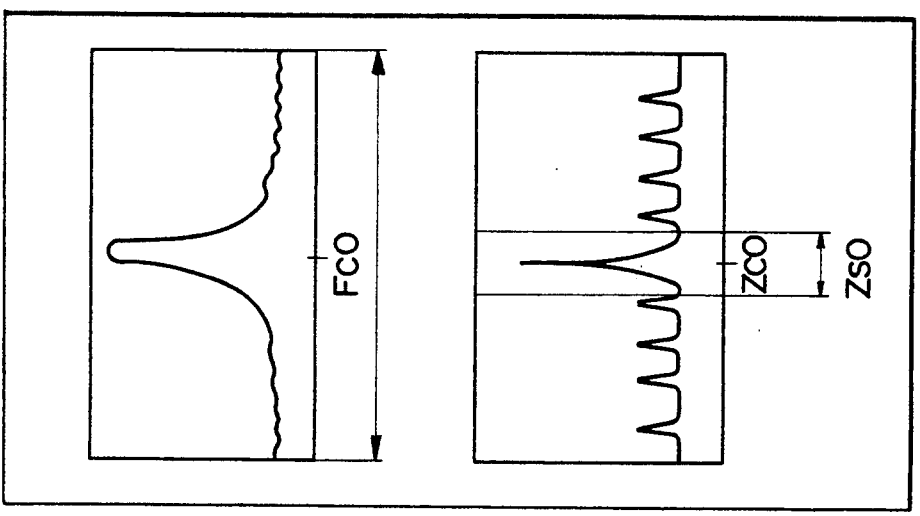

The upper and lower parts of FIG. 5A show initial display screens for wide-band spectrum display and narrow-band spectrum display before the width of the zone marker is changed.

(1) The width of the zone marker is changed by the zone width setting section 5b. At this time, the zone width setting section 5b outputs a width value Zsl (value of width information D1).

(2) The zone width memory 12b stores the value Zsl of width information D1. The value Zsl is delivered to the display controller 9 as width information D2, and the width of the zone marker on the wide-band spectrum display is changed in accordance with the value Zsl. The lower screen in FIG. 5B shows the state wherein the width of the zone marker has been changed. The position of the zone marker is unchanged and is Zco.

(3) The FG span calculation section 14b receives the value Zsl of width information D4 from the zone width memory 12b. On the basis of this value and the value Bso of span information H3 determined previously by the BG span setting section 4b, the FG span calculation section 14b calculates a band Fsl for narrow-band spectrum measurement according to the following equation and outputs the band Fsl as center information B4.

$Fsl = Bso \cdot (Zsl/500)$ (4) The FG span memory 13b stores the value Fsl of span information B4, and outputs the value Fsl as value of span information B2.

(5) When the BG/FG switch controller 10 sets the switch 2 on the n-side, the measuring controller 7h receives the value Fco of center information A2 and the value Fsl of span information B2, and enables the respective parts of the measuring unit 7 to perform narrow-band spectrum measurement with the center frequency Fco and the band width Fsl.

In this case, the measuring controller 7h sets the band and sweep time in the BPF 7c and sweep signal generator 7g in accordance with the measurement resolution that meets the following equation, thus effecting the measurement.

$\text{sweep time} \geq Fsl/(\text{measurement resolution})^2 \cdot K$ (6) The subsequent operations are the same as the operations (6) and (7) in Section [I].

The upper screen in FIG. 5B shows an example of narrow-band spectrum display in which the band width has been changed.

A special case of setting the width of the zone marker will now be described.

Figure 5C:
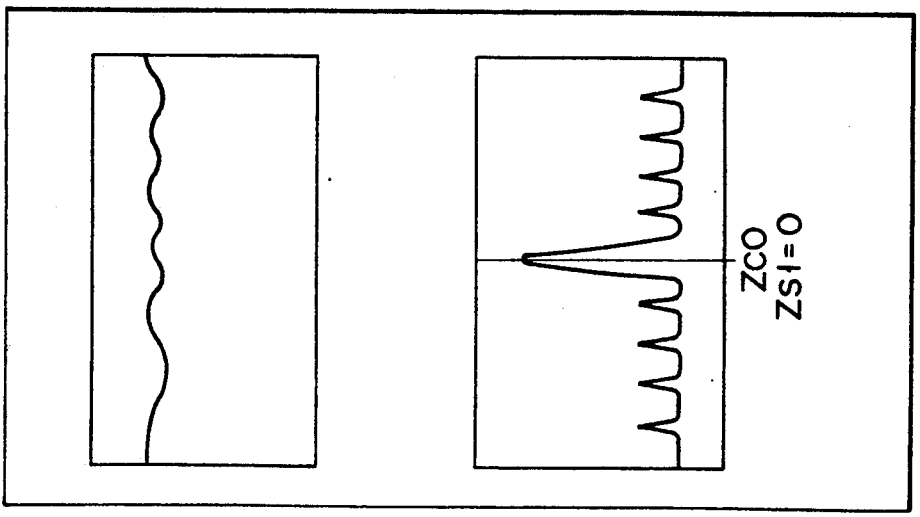

In a special case, the width Zsl of the zone marker may be set to zero. In this case, Fsl=0. The lower screen and upper screen in FIG. 5C show examples of wide-band spectrum display and narrow-band spectrum display in this case. In the wide-band spectrum display on the lower screen of FIG. 5C, the zone marker indicates a one-point frequency. In the narrow-band spectrum display on the upper screen of FIG. 5C, the entire abscissa represents frequency Fco. Thus, the upper screen in FIG. 5C displays the measured temporal variation of the magnitude of the spectrum at a single frequency Fco. In other words, the upper screen of FIG. 5C shows the display in the time region. In this case, the sweep time may be set so as to attain a sweep speed which allows display in accordance with the temporal change of magnitude of the spectrum. [III] Setting of Center Frequency of Narrow-band Spectrum The lower part and upper part of FIG. 6A show initial display screens for wide-band spectrum display and narrow-band spectrum display before the center frequency of the narrow-band spectrum is changed.

(1) The center frequency for narrow-band spectrum measurement and display is changed by the FG center setting section 6a. At this time, the FG center setting section 6a outputs a center value Fcl (value of center information A1).

(2) The FG center memory 13a stores the value Fcl of center information A1 and outputs it as center information A2.

(3) The operations relating to the narrow-band spectrum measurement and display are the same as the operations (5) to (7) in section [I].

The upper screen in FIG. 6B shows an example of narrow-band spectrum display in which the center frequency has been changed.

(4) The zone position calculation section 15a receives the value Fcl of center information A3 from the FG center memory 13a. On the basis of this value, as well as the value Bco of center information G3 and value Bso of span information H3 set previously by the BG center setting section 4a and BG span setting section 4b and stored in the BG center memory 11a and BG span memory 11b, the zone position calculation section 15a calculates a zone marker position Zcl for wide-band spectrum measurement according to the following equation and outputs it as position information C3.

$$Zcl = 500 \cdot [Fcl - (Bco - Bso/2)]/Bso$$

(5) The zone position memory 12a stores the value Zcl of position information C3 and outputs the value Zcl to the display controller 9 as position information C2, thus changing the zone marker position on the wide-band spectrum display in accordance with the value Zcl. The lower screen of FIG. 6B shows the state wherein the zone marker position has been changed.

[IV] Setting of Frequency Span of Narrow-band Spectrum

Figure 7A:
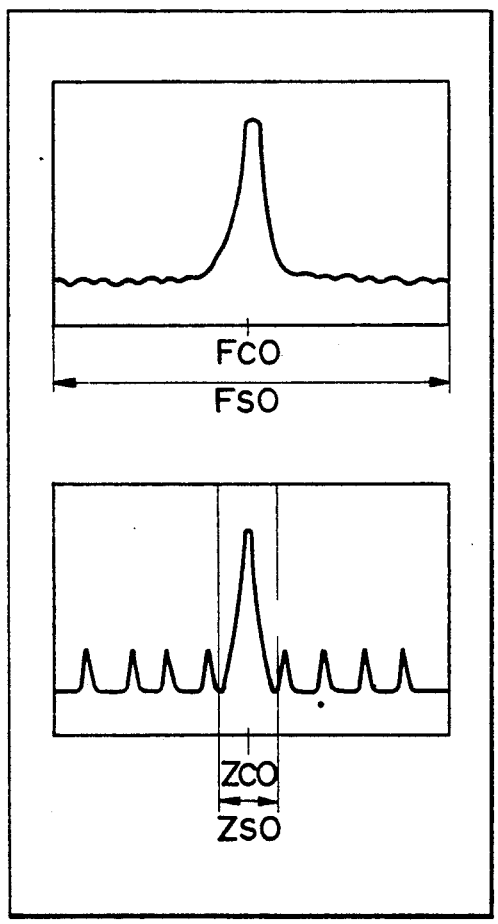

The lower part and upper part of FIG. 7A show initial display screens for wide-band spectrum display and narrow-band spectrum display before the center frequency of narrow-band spectrum is changed.

(1) The band width for narrow-band spectrum measurement and display is changed by the FG span setting section 6b. At this time, the FG span setting section 6b outputs a span value Fsl (value of span information B1).

(2) The FG span memory 13b stores the value Fsl of span information B1 and outputs the value Fsl as span information B2.

(3) The operations relating to the narrow-band spectrum measurement and display are the same as the operations (5) and (6) in section [II].

Figure 7B:
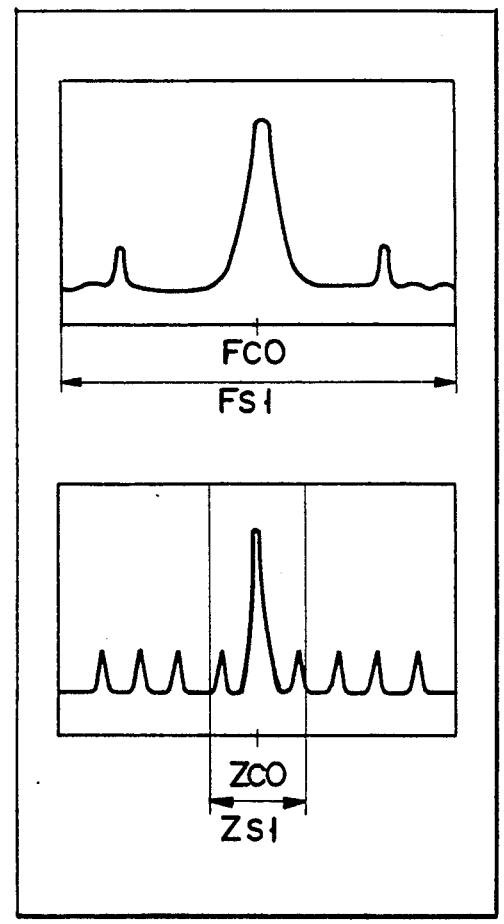

The upper screen in FIG. 7B shows an example of narrow-band spectrum display wherein the band width has been changed.

(4) The zone width calculation section 15b receives the value Fsl of span information B3 from the FG center memory 13b. On the basis of this value, as well as the value Bso of span information H3 set previously by the BG span setting section 4b and stored in the BG span memory 11b, the zone width calculation section 15b calculates a zone marker width Zsl on wide-band spectrum display according to the following equation and outputs it as width information D3.

$$Zsl = 500 \cdot (Fsl/Bso)$$

(5) The zone width memory 12b stores the value Zsl of span information D3 and outputs the value Zsl as width information D2 to the display controller 9, thus changing the zone marker width on the wide-band spectrum display in accordance with the value Zsl. The lower screen of FIG. 7B shows the state wherein the zone marker width has been changed.

In setting the frequency span of narrow-band spectrum, there is a special case where the frequency span $Fsl = 0$. When the frequency span is changed from Fso ($\neq 0$) to $Fsl = 0$, the narrow-band spectrum display is changed from that shown in the upper screen of FIG. 5A to that in the upper screen of FIG. 5C. The narrow-band spectrum display on the upper screen of FIG. 5C indicates that the measurement and display on the time region is performed, as in the case where the zone marker width Zsl is 0, which was stated in the latter part of section [II].

[V] Setting of Center Frequency of Wide-band Spectrum

Figure 8A:
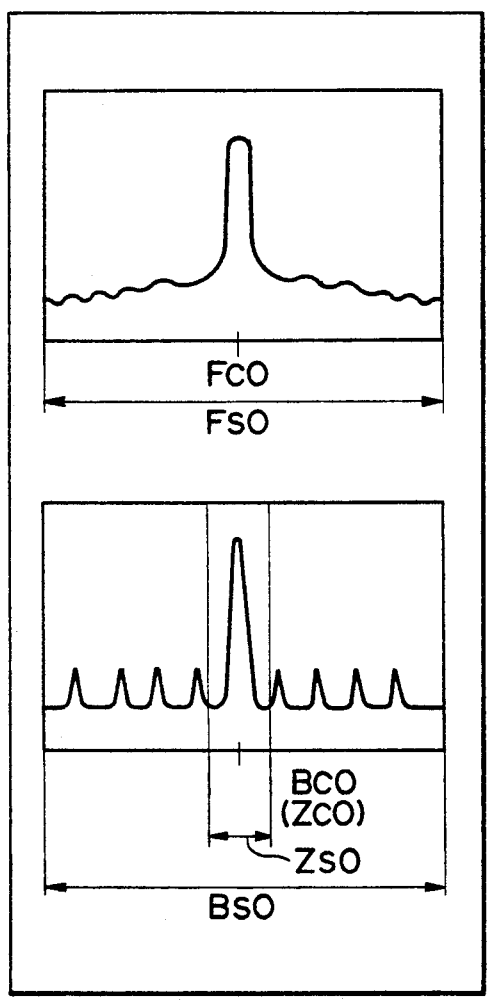

The lower part and upper part of FIG. 8A show initial display screens for wide-band spectrum display and narrow-band spectrum display before the center frequency of the wide-band spectrum is changed.

(1) The center frequency for wide-range spectrum measurement and display is changed by the BG center setting section 4a. At this time, the BG center setting section 4a outputs a center value Bcl (value of center information G1).

(2) The BG center memory 11a stores the value Bcl of center information G1, and outputs it as center information G2.

(3) When the BG/FG switch controller 10 sets the switch 2 on the m-side, the measuring controller 7h receives the value Bcl of center information G2 and the value Bso of span information H2. The measuring controller 7h enables the respective parts of the measuring unit 7 to perform wide-band spectrum measurement with the center frequency Bcl and band width Bso.

(4) The BG waveform memory 8a stores the level of each spectrum output from the data processor 7f, in relation to the corresponding frequency.

(5) The display controller 9 enables the BG area 2a of the display 2 to display the level of each spectrum stored in the BG waveform memory 8a, in relation to the corresponding frequency.

Figure 8B:
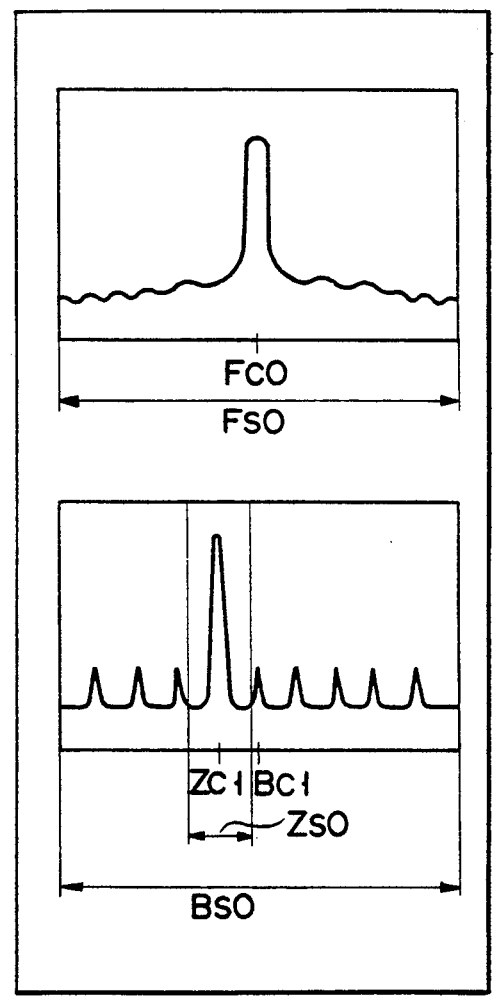

Consequently, the wide-band spectrum displayed on the lower screen of FIG. 8A is changed to that on the lower screen of FIG. 8B.

In this case, the zone marker position is also changed, as can be seen from the lower screen of FIG. 8B. Next, this operation will be explained.

(6) The zone position calculation section 15a receives the value Bcl of center information G3 from the BG center memory 11a. On the basis of this value, as well as the value Fco of center information A3 and the value Fso of span information B3 set previously by the FG center setting section 6a and FG span setting section 6b, the zone position calculation section 15a calculates a zone marker position Zcl according to the following equation and outputs it as position information C3.

$$Zcl = 500 \cdot [Fco - (Bcl - Bso/2)]/Bso$$

(7) The zone position memory 12a stores the value Zcl of position information C3. Then, the value Zcl is sent to the display controller 9 as position information C2, thereby changing the zone marker position on the wide-band spectrum display in accordance with the value Zcl. The lower screen of FIG. 8B shows the state wherein the position of the zone marker has been changed.

[VI] Setting of Frequency Span of Wide-band Spectrum

Figure 9A:
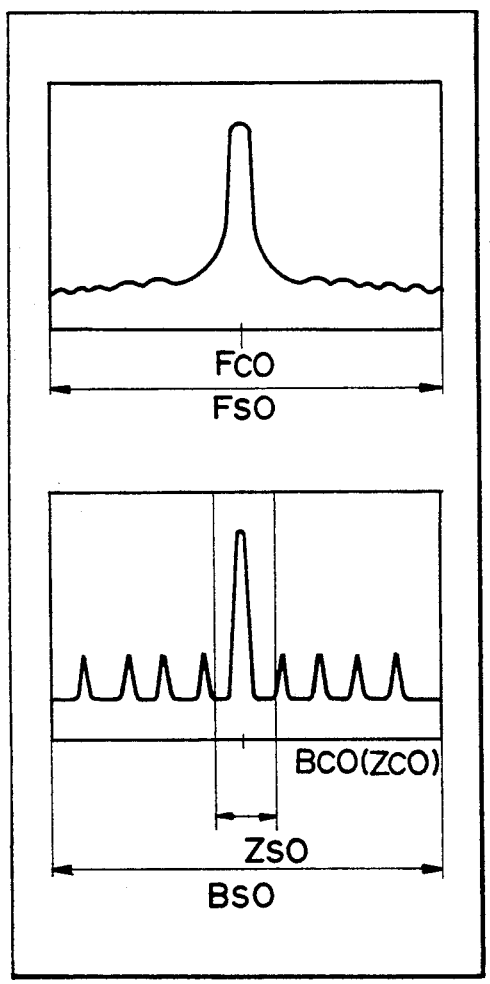

The lower part and upper part of FIG. 9A show initial display screens for wide-band spectrum display and narrow-band spectrum display before the band width of the wide-band spectrum is changed.

(1) The band width for wide-band spectrum measurement and display is changed by the BG span setting section 4b. At this time, the BG span setting section 4b outputs a span value Bcl (value of span information H1).

(2) The BG center memory 11a stores the value Bsl of span information H1, and outputs the value Bsl as value of span information H2.

(3) The operations relating to the wide-band spectrum measurement and display are the same as the operations (3) to (5) in section [V].

Figure 9B:
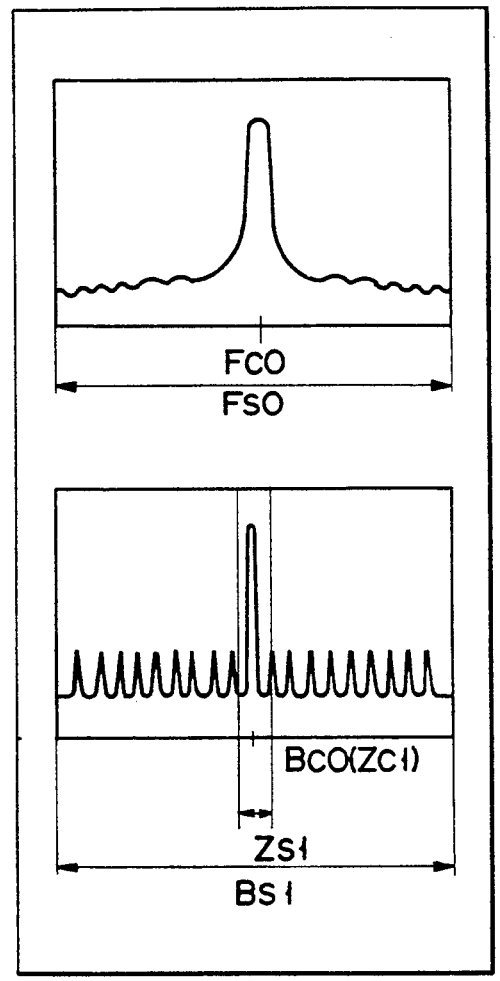

As a result of these operations, the wide-band spectrum display shown in the lower screen of FIG. 9A is changed to that shown in the lower screen of FIG. 9B.

In this case, as can be seen from the lower screen of FIG. 9B, the position and width of the zone marker are also changed. This operation will now be described.

(4) The zone position calculation section 15a receives the value Bsl of span information H3 from the BG span memory 11b. On the basis of this value, as well as the value Fco of center information A3 and value Bco of center information G3 set previously by the FG center setting section 6a and BG center setting section 4a, the zone position calculation section 15a calculates a zone marker position Zcl according to the following equation and outputs it as position information C3.

$$Zcl = 500 \cdot [Fco - (Bco \cdot Bsl/2)]/Bsl$$

(5) The zone position memory 12a stores the value Zcl of position information C3.

(6) The zone width calculation section 15b receives the value Bsl of span information H3 from the BG span memory 11b. On the basis of this value, as well as the value Fso of span information B3 set previously by the FG span setting section 6b, the zone width calculation section 15b calculates a zone marker width Zsl according to the following equation and outputs it as width information D3.

$$Zsl = 500 \, (Fso/Bsl)$$

(7) The zone width memory 11b stores the value Zsl of width information D3.

(8) The display controller 9 receives the value of Zcl of position information C2 from the zone position memory 12a and the value Zsl of width information D2 from the zone width memory 12b. The controller 9 enables the zone marker with the width Zsl to be displayed at the position Zcl along with the wide-band spectrum.

In this case, the zone marker position on the wide-band spectrum display is changed, as shown in the lower screen of FIG. 9B. The narrow-band spectrum display, however, is unchanged, as shown in the upper screens of FIGS. 9A and 9B. In this case, though the zone marker position and the point of width of the marker are changed by frequency span setting for wide-band spectrum, the frequency of the marker is unchanged.

In connection with the above, a description will now be given of the case where the FG is changed in accordance with the change of BG, without changing the zone marker (position and width).

[VII] Setting of Center Frequency of Wide-band Spectrum

The lower part and upper part of FIG. 10A show initial display screens for wide-band spectrum display and narrow-band spectrum display before the center frequency of the wide-band spectrum is changed.

(1) The center frequency for wide-range spectrum measurement and display is changed by the BG center setting section 4a. At this time, the BG center setting section 4a outputs a center value Bcl (value of center information G1).

(2) The BG center memory 11a stores the value Bcl of center information G1, and outputs it as center information G2.

(3) When the BG/FG switch controller 10 sets the switch 2 on the m-side, the measuring controller 7h receives the value Bcl of center information G2 and the value Bso of span information H2. The measuring controller 7h enables the respective parts of the measuring unit 7 to perform wide-band spectrum measurement with the center frequency Bcl and band width Bso.

(4) The BG waveform memory 8a stores the level of each spectrum output from the data processor 7f, in relation to the corresponding frequency.

(5) The display controller 9 enables the BG area 2a of the display 2 to display the level of each spectrum stored in the BG waveform memory 8a, in relation to the corresponding frequency.

As a result of these operations, the wide-band spectrum displayed on the lower screen of FIG. 10A is changed to that on the lower screen of FIG. 10B.

In this case, the zone marker position is not changed, as is seen from the lower screen of FIG. 10B. Thus, the center of FG is changed consequently. Next, this operation will be explained.

(6) The FG center calculation section 14a receives the value Zcl of position information C4 from the zone position memory 12a. On the basis of this value, as well as the value Bco of center information G3 and the value Bso of span information H3 set previously by the BG center setting section 4a and BG span setting section 4b, the FG center calculation section 14 calculates a center frequency Fcl for narrow-band spectrum measurement according to the following equation and outputs it as center information A4.

$$Fcl = (Bco - Bso/2) + Bso \cdot (Zcl/500)$$

(7) The FG center memory 13a stores the value Fcl of center information A4, and outputs it as center information A2.

(8) When the switch 2 is set to the n-side by the BG/FG switch controller 10, the measuring controller 7h receives the value Fcl of center information A2 and the value Fso of span information B2, thereby enabling the respective parts of the measuring unit 7 to perform narrow-band spectrum measurement with the center frequency Fcl and the band width Fso.

(9) The FG waveform memory 8b stores the level of each spectrum output from the data processor 7f in relation to the corresponding frequency.

(10) The display controller 9 enables the FG area 2b of the display to display the level of each spectrum stored in the FG waveform memory 8b, in relation to the corresponding frequency.

Figure 11A:
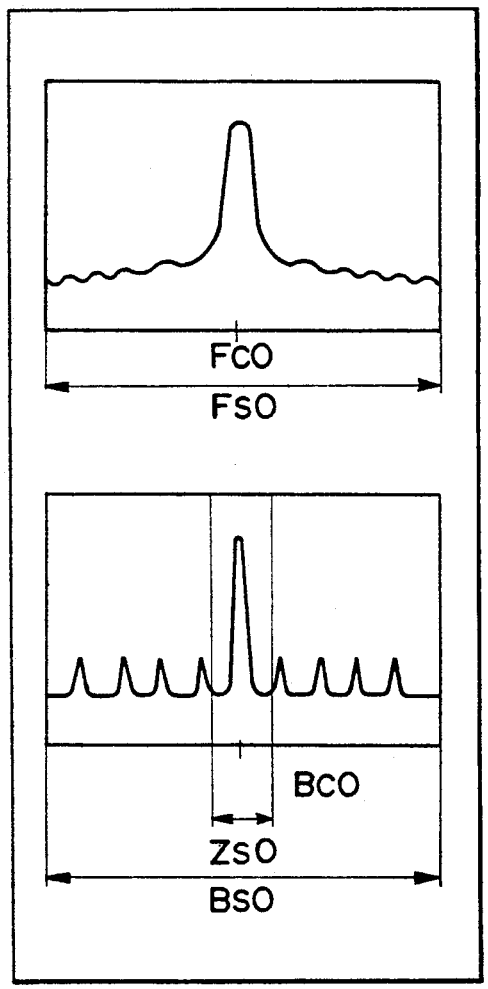

Consequently, the narrow-band spectrum displayed on the upper screen of FIG. 10A is changed, as shown on the upper screen of FIG. 10B. [VIII] Setting of Frequency Span of Wide-band Spectrum The lower part and upper part of FIG. 11A show initial display screens for wide-band spectrum display and narrow-band spectrum display before the band width of the wide-band spectrum is changed.

(1) The band width for wide-band spectrum measurement and display is changed by the BG span setting section 4b. At this time, the BG span setting section 4b outputs a span value Bcl (value of span information H1).

(2) The BG center memory 11a stores the value Bsl of span information H1, and outputs the value Bsl as value of span information H2.

(3) The operations relating to the wide-band spectrum measurement and display are the same as the operations (3) to (5) in section [V]. As a result of these operations, the wide-band spectrum display shown in the lower screen of FIG. 11A is changed to that shown in the lower screen of FIG. 11B.

Figure 11B:
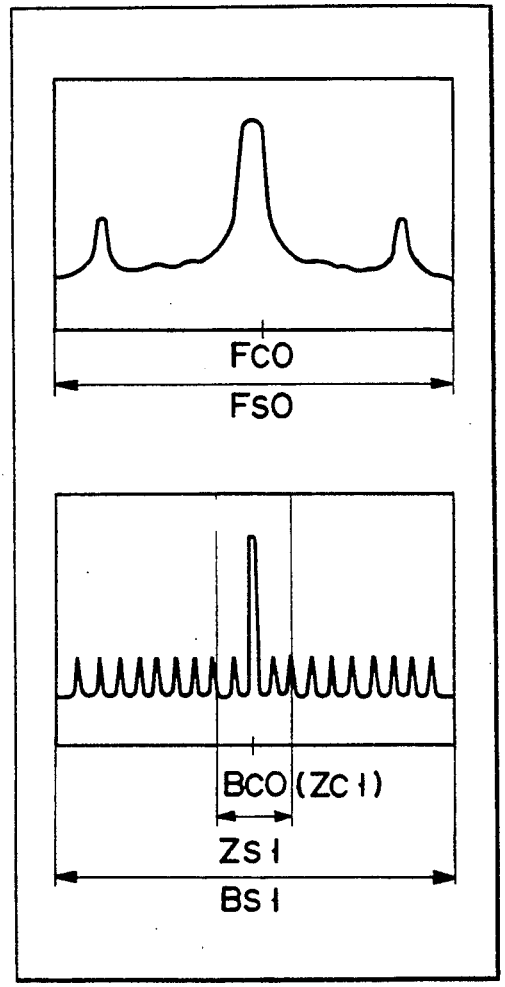

In this case, as can be seen from the lower screen of FIG. 11B, the position and width of the zone marker are not changed. Thus, the center and span of FG are changed in accordance with the change of BG span. This operation will now be described.

(4) The FG center calculation section 14a receives the value Zcl of position information C4 from the zone position memory 12a. On the basis of this value, as well as the value Bco of center information G3 and the value Bso of span information H3 set previously by the BG center setting section 4a and BG span setting section 4b, the FG center calculation section 14 calculates a center frequency Fcl for narrow-band spectrum measurement according to the following equation and outputs it as center information A4.

$$Fcl = (Bco - Bso \cdot /2) + Bso \cdot (Zcl/500)$$

(5) The FG center memory 13a stores the value Fcl of center information A4, and outputs it as center information A2.

(6) The FG span calculation section 14b receives the value Zsl of width information D4 from the zone width memory 12b. On the basis of this value and the value Bso of span information H3 determined previously by the BG span setting section 4b, the FG span calculation section 14b calculates a band Fsl for narrow-band spectrum measurement according to the following equation and outputs the band Fsl as center information B4.

$$Fsl = Bso \cdot (Zsl/500)$$

(7) The FG span memory 13b stores the value Fsl of span information B4, and outputs the value Fsl as value of span information B2.

(8) When the BG/FG switch controller 10 sets the switch 2 on the n-side, the measuring controller 7h receives the value Fco of center information A2 and the value Fsl of span information B2, and enables the respective parts of the measuring unit 7 to perform narrow-band spectrum measurement with the center frequency Fco and the band width Fsl.

In this case, the measuring controller 7h sets the band (Fsl) and sweep time in the BPF 7c and sweep signal generator 7g in accordance with the measurement resolution (RBW) that meets the following equation, thus effecting the measurement.

$$\text{sweep time} \geq Fsl/(\text{measurement resolution})^2 \cdot K$$

(9) The subsequent operations are the same as the operations (6) and (7) in Section [I].

The upper screen in FIG. 11B shows an example of narrow-band spectrum display in which the band width has been changed.

In the above embodiment, the constructions of the BG setting memory 11, zone setting memory 12 and FG setting memory 13 can be modified in accordance with the types of circuits connected to these memories. Only if the first and second display change sections It is sufficient if the memories are constructed so as to realize the flow of signals, which enables the first and second display change sections to fully perform the above functions.

Each of the BG setting section 4, zone setting section 5 and FG setting section 6 may comprise one or two setting sections, and these sections may be switched and commonly used. Any type of setting section may be used, if it can convert the operator's action to an electric signal and can output a signal matching the associated circuit. For example, the setting section may comprise an encoder with a knob, and an interface circuit.

Regarding the mode of display, the narrow-band spectrum display and wide-band spectrum display may be effected on the same area of the display. Color display makes clearer the displayed data.

In the present invention, the first display change section allows the operator to change mainly the position and width of the zone marker while observing the wide-band spectrum display, with fineness corresponding to the band width of wide-band spectrum measurement. In addition, in accordance with the change of the zone marker, the measurement conditions (center frequency and band width) on narrow-band spectrum display are automatically changed.

The second display change section allows the operator to change mainly the measurement conditions (center frequency and band width) on narrow-band spectrum display while observing the narrow-band spectrum display, with a display mode which can easily be observed. That is, the conditions can be changed with fineness corresponding to the band width of narrow-band spectrum measurement. In addition, the change of the center frequency and band width is automatically reflected on the change in display position and width of the zone marker for wide-band spectrum display.

Furthermore, since the measuring controller is provided, when the measurement band width is changed by the output from the first and second display change sections, the measurement conditions (sweep time, measurement resolution) are automatically controlled to reduce measurement error. Therefore, precise measurement is ensured, in addition to the above-mentioned high operability and easy observation.

Figure 12:
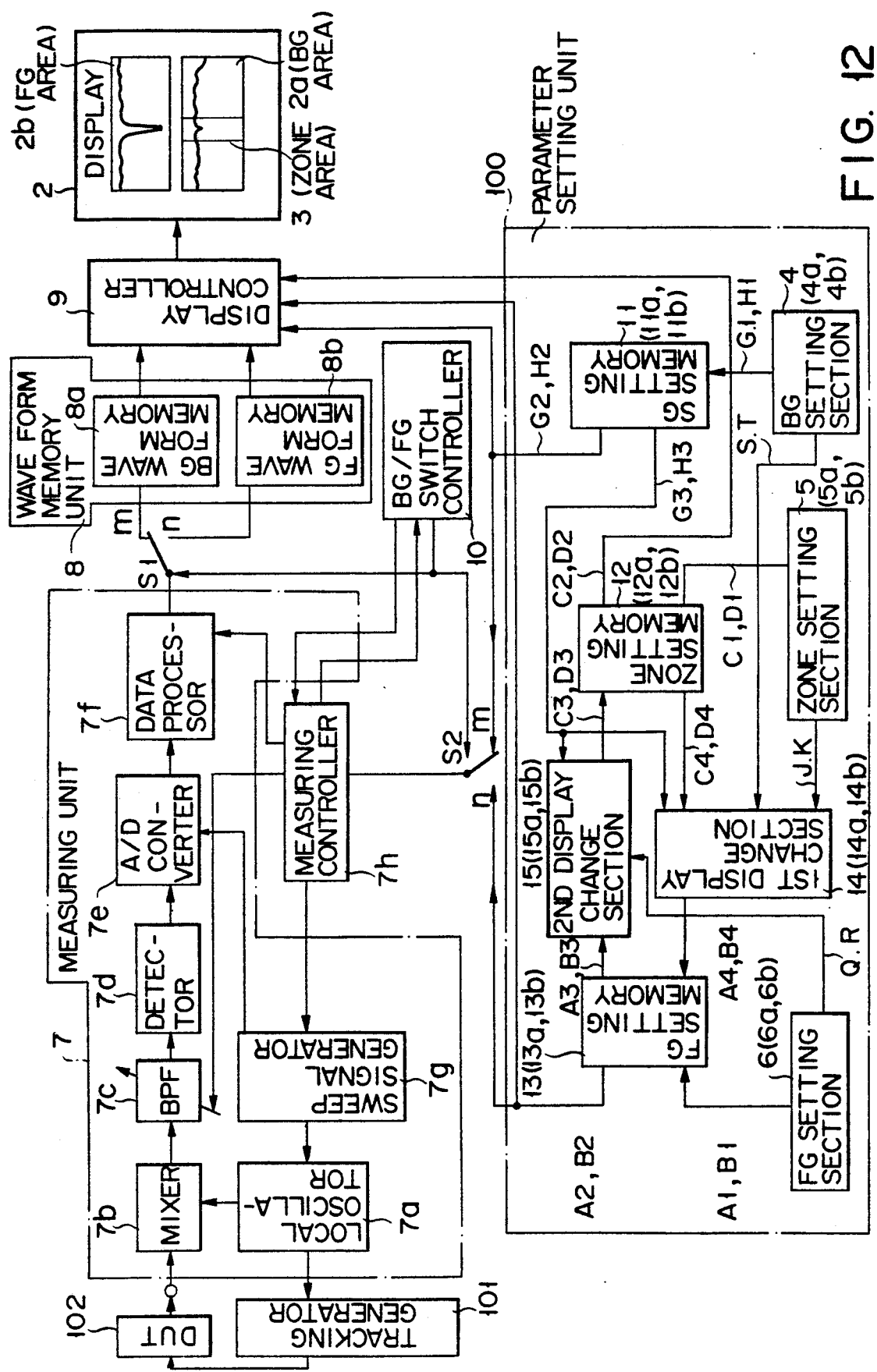
FIG. 12 shows the structure of another embodiment of the present invention.

FIG. 12 shows the structure of another embodiment of the invention applied to a network analyzer.

This network analyzer has a tracking generator 101 for generating a test signal having a variable frequency ft ($ft = f_{LO} - f_{IF}$) based on an output signal having a variable frequency $f_{LO}$ from the local oscillator 7a adding to the structure of the FIG. 1A. The test signal from the tracking generator 101 is supplied to the mixer 7b which output an IF signal having an IF frequency $f_{IF}$ via a device under tested (DUT) 102 such as an amplifier, for example.

In the network analyzer, therefore, the display 2 displays a frequency-level characteristic such as a peak level at the frequency ft in the test signal since the mixer 7b receives a trackinged signal.

Figure 13:
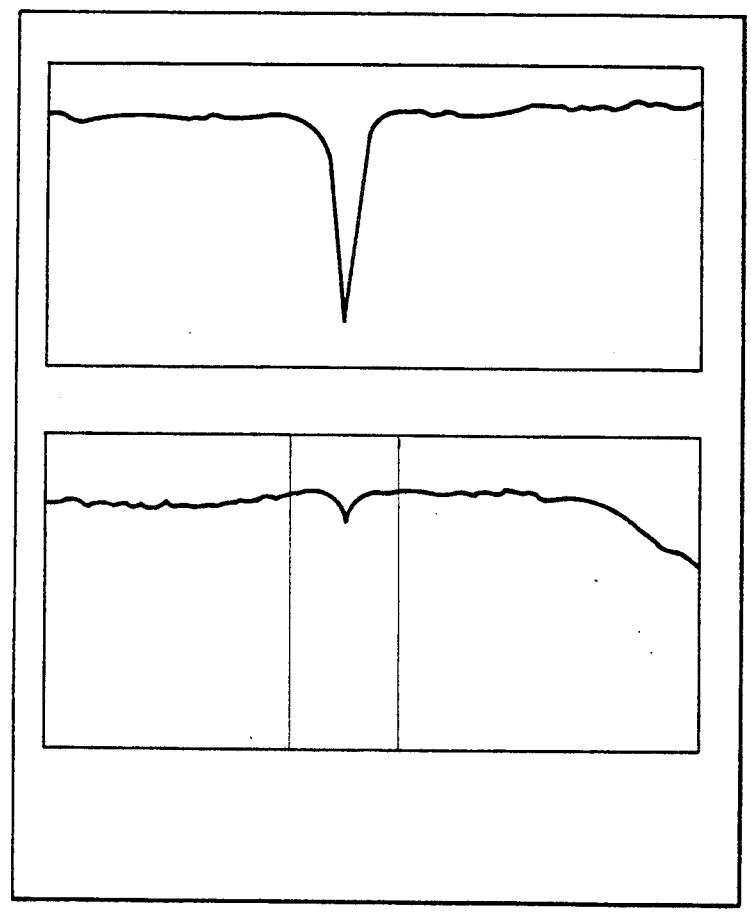
FIG. 13 shows a display example for explaining the operation of FIG. 12.

FIG. 13 shows a display example for explaining the operation of FIG. 12. That is, in the network analyzer, the lower screen of FIG. 13 which is the wide-band sweeping (BG) is seen as a small dip, the upper screen of FIG. 13 which is the narrow-band sweeping (FG) is actually seen as a large dip enlarged the small dip using a enlarged display with the zone marker.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A spectrum analyzer comprising:
   measuring means for alternately outputting wide-band spectrum data and narrow-band spectrum data relating to a signal to be measured;
   waveform memory means for storing the wide-band spectrum data and narrow-band spectrum data output alternately from the measuring means;
   display means having a first display area for displaying the wide-band spectrum data stored in the waveform memory means and a second display area for enlarging and displaying the narrow-band spectrum data stored in the waveform memory means; and
   parameter setting means comprising:
   a) a first setting unit for providing the measuring means with a first measurement condition for outputting the wide-band spectrum data;
   b) a second setting unit for providing the display means with a zone display condition for displaying, on the first display area, a zone marker having a desired position and a desired width relating to the wide-band spectrum data;
   c) first display change means for providing the measuring means with a second measurement condition for outputting the narrow-band spectrum data corresponding to the zone display condition, in accordance with the zone display condition provided by the second setting unit, for changing the second measurement condition for the measuring means, in accordance with the zone display condition provided by the second setting unit, for changing one of the position and the width of the zone marker displayed on the first display area of the display means, and for changing one of the center frequency and the band width of the narrow-band spectrum data enlarged and displayed on the second display area;
   d) a third setting unit for providing the measuring means with a third measurement condition for changing and outputting the narrow-band spectrum data set under the second measurement condition; and
   e) a second display change means for changing one of the center frequency and the band width of the narrow-band spectrum data enlarged and displayed on the second display area of the display means in accordance with the third measurement condition provided by the third setting unit, and for changing one of the position and the width of the zone marker displayed on the first display area;
   said first display change means including first calculation means for calculating center frequency information and band-width information, to thereby obtain narrow-band spectrum data included in the second measurement condition in accordance with position information and width information included in the zone display condition provided by the second setting unit; and
   said parameter setting means further comprising a narrow-band setting memory means for storing center frequency information and band-width information, to thereby obtain the narrow-band spectrum data calculated by said first calculation means.

2. The spectrum analyzer according to claim 1, further comprising:
   control means for factors including the band width, and the measurement resolution and the sweep time of the measuring means according to the change of the band width, which factors are included in the first to third measurement conditions provided to the measuring means, so as to satisfy the following formula:

sweep time $\geq$ band width/(measurement resolution)$^2 \cdot K$ ($K$ = a constant).

3. The spectrum analyzer according to claim 1, wherein said first display change means includes means for changing the second measurement condition for the measuring means in accordance with change of the first measurement condition provided by the first setting unit, and for changing one of the center frequency and the band width of the narrow-band spectrum data enlarged and displayed on the second display area of the display means.

4. The spectrum analyzer according to claim 1, wherein said second display change means includes means for changing one of the position and the width of the zone marker displayed on the first display area of the display means, in accordance with the change of the first measurement condition provided by the first setting unit.

5. The spectrum analyzer according to claim 1, wherein said measuring means includes converter means for converting said signal to be measured into an intermediate frequency signal, by means of a local oscillation signal which is swept in a predetermined frequency range; a variable band-width band-pass filter for selectively analyzing the intermediate frequency signal from the converter means, so that the intermediate frequency signal has predetermined wide-band and narrow-band characteristics; a detector for detecting the intermediate frequency signal which has passed through the variable band-width band-pass filter; and A/D converter for converting the output from the detector into a digital signal; and a data processor unit for processing the digital signal from the A/D converter and outputting the processed digital signal as spectrum data having a desired band, whereby the measuring means detects the spectrum of the signal to be measured in a frequency region and outputs a level of the magnitude corresponding to the frequency of the spectrum.

6. The spectrum analyzer according to claim 5, wherein said converter means includes a local oscillator for oscillating said local oscillation signal, and a sweep signal generator for generating a signal for sweeping the oscillation frequency of the local oscillator, with a predetermined frequency as a center frequency, over a predetermined measurement band width and for a predetermined sweep time.

7. The spectrum analyzer according to claim 5, wherein the relationship between the measurement band width, sweep time and measurement resolution are controlled so as to satisfy the formula:

$$\text{sweep time} \geq \text{measurement band width}/(\text{measurement resolution})^2 \cdot K$$

where K = a constant, whereby the band-pass of said variable band-width band-width band-pass filter variably determines the measurement resolution of the spectrum analyzer.

8. The spectrum analyzer according to claim 1, wherein said waveform memory means includes a first memory area and a second memory area for storing the wide-band spectrum data and narrow-band spectrum data, as levels of their spectra, at addresses associated with the measurement frequencies.

9. The spectrum analyzer according to claim 8, wherein the first and second display areas of the display means have display points on the abscissas, the number of the display points corresponding to the number of addresses in said first and second memory areas, and the number of the addresses and the number of the display points being equal.

10. The spectrum analyzer according to claim 9, further comprising:

display control means for displaying the wide-band spectrum data and narrow-band spectrum data stored in the first and second memory areas of the waveform memory means on the corresponding first and second display areas, and for carrying out control to display the zone marker set by the second setting unit on the first display area.

11. The spectrum analyzer according to claim 2, further comprising:

switch control means for carrying out control to enable, via the control means, the measuring means to alternately output the wide-band spectrum data and narrow-band spectrum data.

12. The spectrum analyzer according to claim 1, wherein said second setting unit includes means for setting a width of said zone marker at substantially zero.

13. The spectrum analyzer according to claim 1, wherein said second display change means includes second calculation means for calculating position information and width information of the zone marker relating to the wide-band spectrum data displayed on the first display area, in accordance with the center frequency information and band-width information from the narrow-band setting memory for obtaining the narrow-band spectrum data, and said parameter setting means includes a zone setting memory for storing the position information and width information of the zone marker calculated by the second calculation means.

14. The spectrum analyzer according to claim 13, wherein said parameter setting means includes a wide-band setting memory for storing center frequency information and band-width information for obtaining the wide-band spectrum data included in the first measurement condition provided by the first setting unit.

15. The spectrum analyzer according to claim 14, wherein said first and second display change means comprise a microcomputer and peripheral circuits thereof.

16. A network analyzer comprising:

measuring means for alternately outputting wide-band transmission characteristic data and narrow-band transmission characteristic data relating to a device under tested according to a test signal which is being tracked;

waveform memory means for storing the wide-band transmission characteristic data and narrow-band transmission characteristic data output alternately rom the measuring means;

display means having a first display area are displaying the wide-band transmission characteristic data stored in the waveform memory means and a second display area for enlarging and displaying the narrow-band transmission characteristic data stored in the waveform memory means; and parameter setting means comprising:

a) a first setting unit for providing the measuring means with a first measurement condition for outputting the wide-band transmission characteristic data;

b) a second setting unit for providing the display means with a zone display condition for displaying, on the first display area, a zone marker having a desired position and a desired width relating to the wide-band transmission characteristic data;

c) first display change means for providing the measuring means with a second measurement condition for outputting the narrow-band transmission characteristic data corresponding to the zone display condition, in accordance with the zone display condition provided by the second setting unit, for changing the second measurement condition for the measuring means, in accordance with the zone display condition provided by the second setting unit, for changing one of the position and the width of the zone marker displayed on the first display area of the display means, and for changing one of the center frequency and the band width of the narrow-band transmission characteristic data enlarged and displayed on the second display area;

d) a third setting unit for providing the measuring means with a third measurement condition for changing and outputting the narrow-band transmission characteristic data set under the second measurement condition; and e) a second display change means for changing one of the center frequency and the band width of the narrow-band transmission characteristic data enlarged and displayed on the second display area of the display means in accordance with the third measurement condition provided by the third setting unit, and for changing one of the position and the width of the zone marker displayed on the first display area;

said first display change means including first calculation means for calculating center frequency information and band-width information, to thereby obtain narrow-band transmission characteristic data included in the second measurement condition in accordance with position information and width information included in the zone display condition provided by the second setting unit; and said parameter setting means further comprising a narrow-band setting memory means for storing center frequency information and band-width information, to thereby obtain the narrow-band transmission characteristic data calculated by said first calculation means.

17. The network analyzer according to claim 16, wherein said second display change means includes second calculation means for calculating position information and width information of the zone marker relating to the wide-band transmission characteristic data displayed on the first display area, in accordance with the center frequency information and band-width information from the narrow-band setting memory for obtaining the narrow-band transmission characteristic data, and said parameter setting means includes a zone setting memory for storing the position information and width information of the zone marker calculated by the second calculation means.

18. The network analyzer according to claim 16, further comprising:

control means for controlling the band width, and the measurement resolution and the sweep time of the measuring means according to the change of the band width, which factors are included in the first to third measurement conditions provided to the measuring means, so as to satisfy the following formula:

sweep time ≧ band width/(measurement resolution)$^2$·K (K = a constant).

19. The network analyzer according to claim 16, wherein said first display change means includes means for changing the second measurement condition for the measuring means in accordance with the change of the first measurement condition provided by the first setting unit, and for changing one of the center frequency and the band width of the narrow-band transmission characteristic data enlarged and displayed on the second display area of the display means.

20. The network analyzer according to claim 16, wherein said second display change means includes means for changing one of the position and the width of the zone marker displayed on the first display area of the display means, in accordance with the change of the first measurement condition provided by the first setting unit.

21. The network analyzer according to claim 16, wherein said measuring means includes a tracking generator for supplying the test signal to the device under tested, converter means for converting said test signal into an intermediate frequency signal, by means of a local oscillation signal which is swept in a predetermined frequency range; a variable band-width band-pass filter for selectively analyzing the intermediate frequency signal from the converter means, so that the intermediate frequency signal has predetermined wide-band and narrow-band characteristics; a detector for detecting the intermediate frequency signal which has passed through the variable band-width band-pass filter; an A/D converter for converting the output from the detector into a digital signal; and a data processor unit for processing the digital signal from the A/D converter and outputting the processed digital signal as spectrum data having a desired band, whereby the measuring means detects the transmission characteristic of the device under tested in a frequency region and outputs a level of the magnitude corresponding to the frequency of the transmission characteristic.

22. The network analyzer according to claim 21, wherein said converter means includes a local oscillator for oscillating said local oscillation signal and a tracking signal for said tracking generator, and a sweep signal generator for generating a signal for sweeping the oscillation frequency of the local oscillator, with a predetermined frequency as a center frequency, over a predetermined measurement band width and for a predetermined sweep time.

23. The network analyzer according to claim 21, wherein the relationship between the measurement band width, sweep time and measurement resolution are controlled so as to satisfy the formula:

sweep time ≧ measurement band width/(measurement resolution)$^2$·K where K = a constant, whereby the band-pass of said variable band-width band-pass filter variably determines the measurement resolution of the network analyzer.

24. The network analyzer according to claim 16, wherein said waveform memory means includes a first memory area and a second memory area for storing the wideband transmission characteristic data and narrow-band transmission characteristic data, as levels of their transmission characteristic, at addresses associated with the measurement frequencies.

25. The network analyzer according to claim 24, wherein the first and second display areas of the display means have display points on the abscissas, the number of the display points corresponding to the number of addresses in said first and second memory areas, and the number of the addresses and the number of the display points being equal.

26. The network analyzer according to claim 25, further comprising:

display control means for displaying the wide-band transmission characteristic data and narrow-band transmission characteristic data stored in the first and second memory areas of the waveform memory means on the corresponding first and second display areas, and for carrying out control to display the zone marker set by the second setting unit on the first display area.

27. The network analyzer according to claim 18, further comprising:

switch control means for carrying out control to enable, via the control means, the measuring means to alternately output the wide-band transmission characteristic data and narrow-band transmission characteristic data.

28. The network analyzer according to claim 17, wherein said parameter setting means includes a wide-band setting memory for storing center frequency information and band-width information for obtaining the wide-band spectrum data included in the first measurement condition provided by the first setting unit.

29. The network analyzer according to claim 28, wherein said first and second display change means comprise a microcomputer and peripheral circuits thereof.

30. The network analyzer according to claim 16, wherein said second setting unit includes means for setting a width of said zone marker at substantially zero.

* * * * *